(12) United States Patent
Birdsley et al.

(10) Patent No.: US 6,448,096 B1
(45) Date of Patent: Sep. 10, 2002

(54) ATOMIC FORCE MICROSCOPY AND SIGNAL ACQUISITION VIA BURIED INSULATOR

(75) Inventors: Jeffrey D. Birdsley; Michael R. Bruce; Brennan V. Davis; Rosalinda M. Ring, all of Austin; Daniel L. Stone, Cedar Park, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/864,656

(22) Filed: May 23, 2001

(51) Int. Cl.$^7$ ............................................... H01L 21/00
(52) U.S. Cl. ............................................ 438/14; 716/4
(58) Field of Search ............................ 438/14, 15–18, 438/800; 716/4, 5, 17

(56) References Cited

U.S. PATENT DOCUMENTS 6,146,014 A  11/2000  Bruce et al.
6,199,563 B1 *  3/2001  Uehara et al. ............. 164/25.4

* cited by examiner

Primary Examiner—Craig Thompson

(57) ABSTRACT

Analysis of a semiconductor die having silicon-on-insulator (SOI) structure is enhanced by accessing the circuitry within the die from the back side without necessarily breaching the insulator layer of the SOI structure. According to an example embodiment of the present invention, a semiconductor die having a SOI structure and a backside opposite circuitry in a circuit side is analyzed. An atomic force microscope is scanned across a thinned portion of the back side. The microscope responds to an electrical characteristic, such as a logic state, coupled from circuitry via the insulator portion of the die over which the microscope is being scanned. The response of the microscope to the die is detected and used to detect an electrical characteristic of the die.

24 Claims, 3 Drawing Sheets

ATOMIC FORCE MICROSCOPY AND SIGNAL ACQUISITION VIA BURIED INSULATOR

FIELD OF THE INVENTION

The present invention relates generally to semiconductor devices and their fabrication and, more particularly, to testing and defect analysis of semiconductor dies signal acquisition.

BACKGROUND OF THE INVENTION

The semiconductor industry has recently experienced technological advances that have permitted dramatic increases in integrated circuit density and complexity, and equally dramatic decreases in power consumption and package sizes. Present semiconductor technology now permits single-die microprocessors with many millions of transistors, operating at speeds of hundreds of millions of instructions per second to be packaged in relatively small, air-cooled semiconductor device packages.

A by-product of such high-density and high functionality is an increased demand for products employing these microprocessors and devices for use in numerous applications. As the use of these devices has become more prevalent, the demand for faster operation and better reliability has increased. Such devices often require manufacturing processes that are highly complex and expensive.

As the manufacturing processes for semiconductor devices and integrated circuits increase in difficulty, methods for testing and debugging these devices become increasingly important. Not only is it important to ensure that individual dies are functional, it is also important to ensure that batches of dies perform consistently. In addition, the ability to detect a defective manufacturing process early is helpful for reducing the number of defective devices manufactured.

Traditionally, integrated circuits have been tested using methods including directly accessing circuitry or devices within the integrated circuit. Directly accessing the circuitry is difficult for several reasons. For instance, in flip chip type dies, transistors and other circuitry are located in a very thin epitaxially grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the die.

One particular type of semiconductor device structure that presents unique challenges to back side circuit analysis is silicon-on-insulator (SOI) structure. SOI involves forming an insulator, such as an oxide, over bulk silicon in the back side of a semiconductor device. A thin layer of silicon is formed on top of the insulator, and is used to form circuitry over the insulator, and additional circuitry is formed over the thin layer of silicon. The resulting SOI structure exhibits benefits including reduced switch capacitance, which leads to faster operation. Direct access to circuitry for analysis of SOI structure, however, involves milling through the oxide. The milling process can damage circuitry or other structure in the device. Such damage can alter the characteristics of the device and render the analysis inaccurate. In addition, the milling process can be time-consuming, difficult to control, and thus expensive.

The difficulty, cost, and destructive aspects of existing methods for testing integrated circuits are impediments to the growth and improvement of semiconductor technologies involving SOI structure.

SUMMARY OF THE INVENTION

The present invention is directed to a method and system for analyzing a semiconductor die having silicon-on-insulator (SOI) structure in a manner that overcomes the above-discussed impediments. The die includes a back side opposite circuitry in a circuit side, and the die analysis involves acquiring a signal from the circuitry via the insulator of the SOI structure. The present invention is exemplified in a number of implementations and applications, some of which are summarized below.

According to an example embodiment of the present invention, a semiconductor die having SOI structure and a back side opposite circuitry in a circuit side is analyzed. A thinned portion of the back side of the die is scanned with an atomic force microscope. The microscope responds to an electrical characteristic of the circuitry coupled to the microscope via the insulator portion of the SOI structure, and the response is used to detect an electrical characteristic of the circuitry.

According to another example embodiment of the present invention, a system is arranged for analyzing a semiconductor die having silicon-on-insulator (SOI) structure and a back side opposite circuitry in a circuit side. The system includes an atomic force microscope adapted to scan a thinned back side of the die and detect a response to the die. A detection arrangement is adapted to use the response of the microscope to detect an electrical characteristic of the circuitry.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
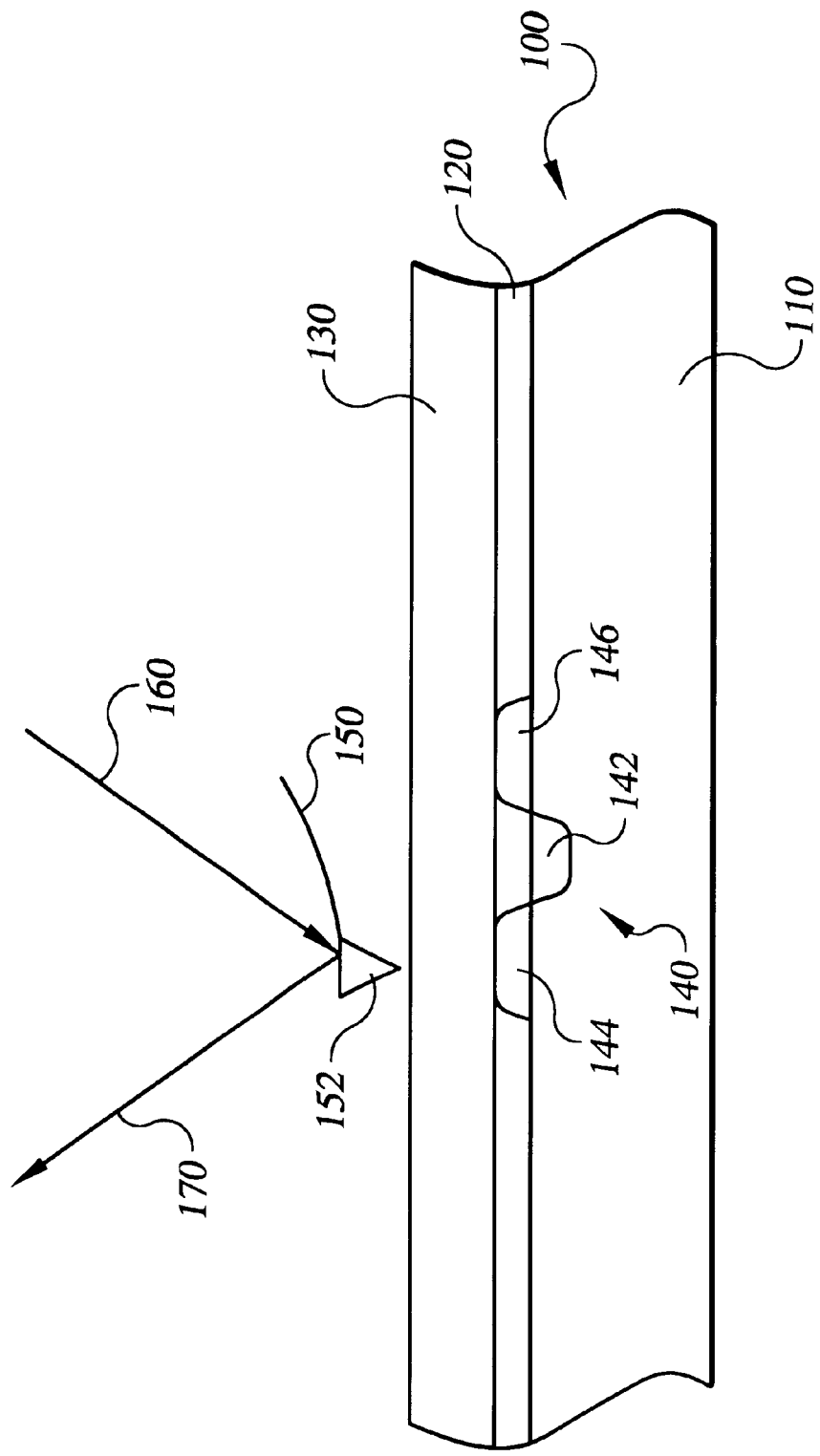
FIG. 1 is a semiconductor die having SOI structure undergoing analysis, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for flip-chip and other type devices having silicon-on-insulator (SOI) structure and requiring or benefiting from analysis involving coupling a signal from circuitry in the die via the insulator portion of the SOI structure. While the present invention is not necessarily limited to such devices, various aspects of the invention may be appreciated through a discussion of various examples using this context.

According to an example embodiment of the present invention, a semiconductor die having SOI structure is analyzed using an atomic force microscope (AFM) to obtain a signal representing an electrical characteristic of circuitry located in a circuit side of the die, opposite a back side. The back side is thinned either prior to or in conjunction with the analysis with the AFM using conventional methods such as chemical-mechanical polishing (CMP), wet etching, and dry etching such as laser and FIB etching. The AFM is scanned across the thinned back side, and electrical characteristics of the circuitry, such as a logic state of a particular circuit node, are capacitively coupled through the insulator portion of the die and cause a response at the AFM. The response is detected and used to detect the electrical characteristic. This is useful for analyzing the circuitry without necessarily removing any of the insulator portion.

The AFM is adapted to be used in one or more selected manners for obtaining a response to the circuitry in the die. For instance in one particular example embodiment of the present invention, the AFM includes a cantilever that deflects in response to electrical charge. In this instance, the electrical state of a circuit node (e.g., a source or drain region), couples an electrical charge through the insulator portion of the SOI structure. As the cantilever is scanned over the insulator, the cantilever deflects in response to the electrical charge, and the amount of deflection varies according to the amount of charge. The deflection of the cantilever is detected and used to detect the electrical state of the circuitry underlying the insulator portion over which the cantilever is scanned.

The detection of the deflection of the cantilever is achieved in various manners, depending upon the selected application. For example, in one implementation a scanning tunneling microscope (STM) is positioned near the cantilever and is used to detect the deflection. In another implementation, a pressure sensor, such as a piezoelectric sensor, is used to detect pressure caused by the deflection of the cantilever, and the pressure is correlated to the deflection of the cantilever. In still another implementation, a laser and a split photodiode are used in conjunction to detect the deflection of the cantilever. The laser is directed at the cantilever, and a reflection of the laser light is detected at the split photodiode. When the cantilever deflects, the reflected laser light is deflected. The photodiode detects the deflection of the reflected light and detects the deflection of the cantilever therefrom.

The scanning of the cantilever over the die is effected in various manners depending upon the results desired and the selected application to which the AFM is being applied. In one example embodiment of the present invention, the cantilever is used in a contact mode and brought into direct contact with the thinned back side. As the cantilever passes over the back side, physical variations in the exposed surface of back side combined with electrical charges coupled via the insulator cause the cantilever to deflect. The deflection is detected and used to detect an electrical characteristic of the die. In a more particular implementation, the AFM is first pre-scanned across the thinned back side to determine the topography of the exposed surface of the thinned back side. The die is then operated and the AFM is again scanned across the thinned back side, and a response including the effects of both the topography and the electrical state of the circuitry in the die is obtained. The effects of the topography determined during the pre-scanning are subtracted from the response, making the net response attributable to the effect of the electrical state of the circuitry. This net response is used for analyzing the die.

In another example embodiment of the present invention, the cantilever of the AFM is raised at a selected distance over the thinned back side of the die and used in a non-contact mode. The position of the cantilever is selected so the cantilever does not come into contact with the die, yet is close enough to the die to respond to an electrical characteristic of the circuitry therein. As the AFM is scanned, the response of the cantilever to the coupled electrical state is detected and used to detect the electrical state of the underlying circuitry.

In some instances, the topography of the thinned back side of the die effects the deflection of the cantilever, even when the cantilever does not come into contact with the die. In these instances, as with the contact method described hereinabove, the die is pre-scanned with the AFM and any response to the topography is detected and used during subsequent scanning to subtract the effects of the topography and improve the ability to detect a response to the circuitry in the die.

Another aspect of the die that affects the ability to obtain a signal is the thickness of substrate in the back side of the die. For example, a thicker back side can insulate any signal that may cause a response in the AFM, as compared to a thinner back side in the same or similar device. The amount of thinning is selected to provide an adequate response for the selected application. For example, when it is desired to detect a state of the circuitry in the die (e.g., whether a transistor is on or off), it may be sufficient to detect any kind of a response from the AFM without necessarily quantifying the response. In this instance, a response from the AFM would indicate a change in the state of a portion of circuitry in the die. However, in some instances it may be desirable to obtain a more precise response, wherein the amount of deflection of the AFM is detected to acquire a more accurate representation of an electrical characteristic or state of the die. In this instance, the amount of thinning is selected to enable the acquisition of a desired response. If the response detected is insufficient to provide sufficient precision, the back side is further thinned and the AFM is again used to detect a response.

In another example embodiment of the present invention, the cantilever is used in an oscillation mode and oscillated at a selected frequency using an oscillator, such as a piezo-electric oscillator. The actual oscillations of the cantilever are affected by the electrical state of the circuitry underlying the portion of the die over which the AFM is being scanned. A phase difference between the oscillations generated at the cantilever and the actual oscillations of the cantilever is used to detect an electrical characteristic of the die. This example embodiment is readily implemented using equipment such as the MultiMode(™) or Dimension(™) Series SPM with NanoScope® controller equipped with an Extender(™) Electronics Module, available from Digital Instruments, Veeco Metrology Group at 112 Robin Hill Road in Santa Barbara, Calif., 93117.

In another example embodiment of the present invention, two or more scans are made with the AFM and selected electrical characteristics of the die are detected as the die is being operated under different conditions. For example, when it is desired to detect the electrical state of a particular circuit node under different operating parameters, the die is operated at a first parameter and is scanned with the AFM. The electrical state of one or more circuit nodes is detected and recorded. The die is then operated under a second selected parameter, and the AFM is again scanned across the thinned back side of the die. The electrical state of the one or more circuit nodes under the second operating parameter is compared to the electrical state existing while the die is being operated under the first parameter, and the die is analyzed therefrom. This is particularly useful, for example, for detecting if a selected circuit node undergoes a state change while being subjected to a state-changing operation. In addition, this is useful for detecting whether the state change occurs at the proper timing interval, and for detecting defects, such as resistive connections, that can alter the timing interval of a state change.

In still another example embodiment of the present invention, a non-defective die is operated under selected conditions and an AFM is used to scan the die and detect an electrical characteristic from one or more portions of circuitry in the die. A die having a suspected defect is then scanned in a similar manner to the non-defective die, and a response to an electrical characteristic from corresponding portions of circuitry in the die is detected. The responses from the non-defective die and the die having a suspect defect are compared, and any differences are noted as circuit portions having a suspect defect. The die is then further analyzed therefrom.

As discussed hereinabove, the present invention is applicable to a variety of analysis techniques, and is also applicable to a variety of types of semiconductor dies. FIG. 1 shows one such semiconductor die 100 undergoing analysis with an AFM employing a laser, according to another example embodiment of the present invention. The die 100 includes a transistor 140 located in a circuit side opposite a back side of the die. The die has been thinned, and an insulator portion 130 of SOI structure is exposed. The transistor includes source/drain regions 144 and 146 formed in a thin silicon region 120 adjacent the insulator 130, and a gate 142. The die is operated and the source/drain region 144 is caused to take on a selected state. An AFM having a cantilever 150 and a tip portion 152 is scanned over the insulator 130 and over the source/drain region 144. Laser light 160 is directed at the tip 152, and a reflection 170 of the light from the tip 152 is detected. As the AFM is scanned across the source/drain region, the electrical state of the source/drain region capacitively couples a charge through the insulator 130 and causes the tip 152 of the cantilever 150 to deflect. The deflection of the cantilever causes changes the path of the reflection 170. The change in the reflection is detected and used to detect the deflection of the cantilever, which is then used to detect the electrical state of the source/drain region 144.

In one implementation, the amount of deflection of the cantilever is determined for selected electrical charges, and the corresponding change in the reflected light is noted. A comparison chart determined using the relationship between the change in the reflected light and the electrical charge required to cause the change is used to correlate the reflection to a selected state of circuitry in the die. In another implementation, the change in the reflected light is used to determine the amount that the cantilever has deflected. Known physical properties of the cantilever are used to determine the charge that would cause the detected amount of deflection of the cantilever, and the corresponding charge of the underlying circuitry are determined therefrom.

Figure 2:
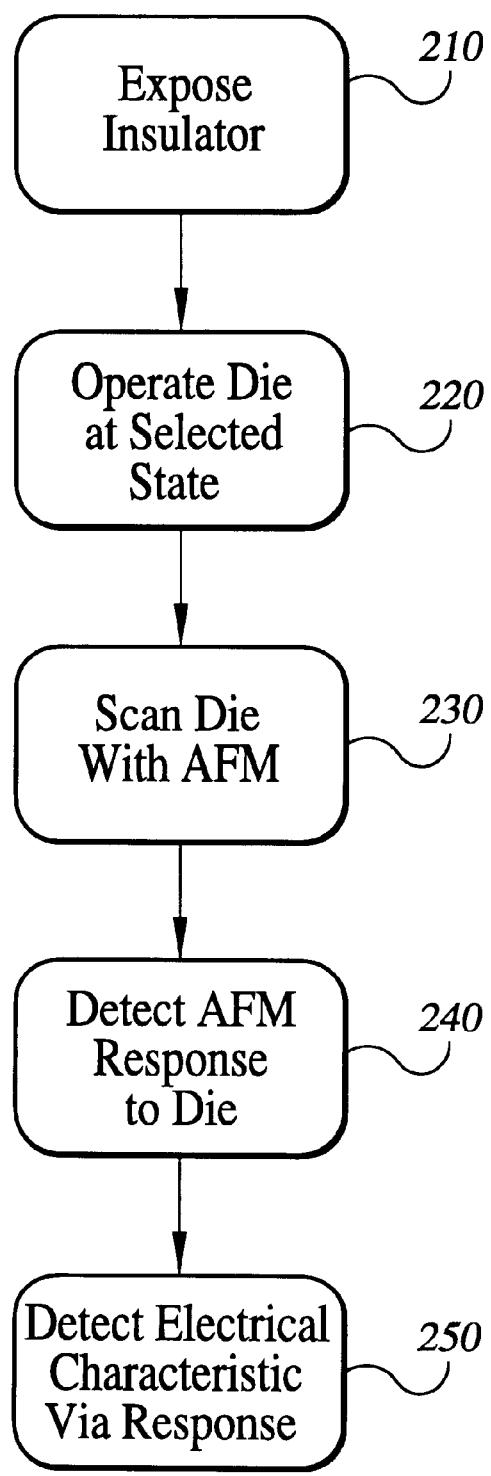
FIG. 2 is a flow diagram for semiconductor die analysis, according to another example embodiment of the present invention.

FIG. 2 is a flow chart showing an example implementation of the present invention. The insulator portion of a semiconductor die having SOI structure is exposed at block 210. The die is operated at a selected state at block 220, and at block 230 is scanned with an AFM. At block 240, a response of the AFM that includes a deflection of a cantilever, such as the one described in connection with FIG. 1, is detected. The detected response of the AFM is used at block 250 to analyze the die.

Figure 3:
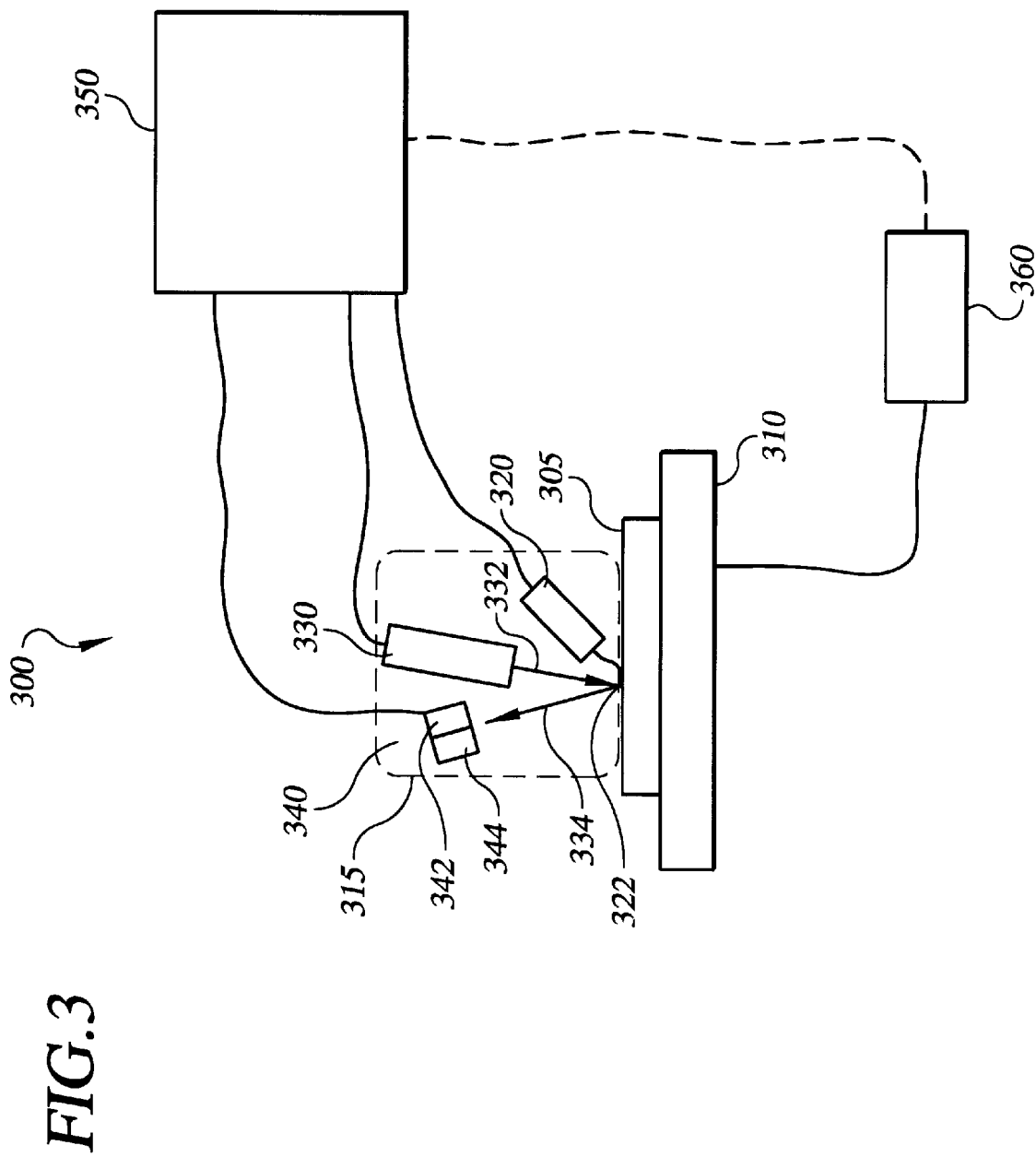
FIG. 3 is a system for analyzing a semiconductor die, according to another example embodiment of the present invention.

FIG. 3 is a system 300 adapted to analyze a semiconductor die, according to another example embodiment of the present invention. The system includes a stage 310 adapted to hold a semiconductor die 305. A power supply 360 is electrically coupled to the stage 310 and adapted to operate the die 305 under selected conditions. An AFM 315 is adapted to scan the die 305 and to detect an electrical characteristic therein. The AFM includes a cantilever 320, a laser 330 and a split photodiode 340, each of which is communicatively coupled to a controller 350 adapted to control the AFM. The laser 330 is adapted to direct laser light 332 at a tip of the cantilever, and a reflection 334 of the light is detected by the split photodiode. The split photodiode 340 includes portions 342 and 344. A tip 322 of the cantilever is adapted to deflect in response to an electrical state in the die. When the cantilever is deflected, the reflected laser light 334 is also deflected and the reflected light incident upon each portion 342 and 344 is altered. For example, as the reflected light is deflected at a sharper angle, the amount of light incident upon photodiode portion 342 increases, and the light incident upon the portion 344 decreases. This change in incident light is used to detect the deflection of the cantilever, and the detected deflection is used to detect the electrical state of circuitry in the die over which the AFM is scanned.

The controller 350 is adapted to operate the AFM in a variety of manners, such as those described hereinabove and including an oscillating mode, a contact mode and a non-contact mode. The controller is further adapted to operate the laser and to interpret a signal from the split photodiode 340 in a manner that facilitates the detection of the deflection of the cantilever tip 322. In addition, the controller 350 is optionally adapted and communicatively coupled to provide a control signal to the power supply 360. The control signal is selected to effect a desired operation of the die, such as to cause the die to operate in a known failure condition or to undergo a state-changing operation.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor die having silicon-on-insulator (SOI) structure and circuitry in a circuit side opposite a back side, the method comprising:

scanning a thinned back side of the die with an atomic force microscope and detecting a response to the die via the insulator structure; and using the response to detect an electrical characteristic of the circuitry.

2. The method of claim 1, further comprising thinning the backside and exposing the insulator portion of the SOI structure, prior to scanning the thinned backside.

3. The method of claim 1, further comprising sufficiently thinning the back side to capacitively couple an electrical signal from circuitry in the die via the thinned back side, prior to scanning the thinned back side.

4. The method of claim 1, wherein scanning a thinned back side of the die with an atomic force microscope comprises:

positioning a cantilever over the insulator portion of the SOI die, the cantilever being adapted to deflect in response to an electrical state of circuitry in the die; and directing a laser beam at the cantilever and detecting a reflection of the laser from the cantilever, the reflection being responsive to the deflection of the cantilever.

5. The method of claim 4, wherein detecting a reflection of the laser from the cantilever includes using a split photodiode.

6. The method of claim 5, wherein using a split photodiode includes aligning the photodiode so the reflected light from an undeflected cantilever is directed about equally to each portion of the split photodiode, and wherein detecting a reflection of the laser includes detecting that the reflection has been deflected to direct more light to one of the split portions of the photodiode than to another split portion of the photodiode.

7. The method of claim 4, further comprising causing the cantilever to oscillate at a selected frequency, wherein the cantilever is adapted to alter its oscillation frequency in response to the electrical state of the circuitry in the die.

8. The method of claim 7, wherein detecting a response to the die includes detecting a phase difference between an oscillator adapted to cause the cantilever to oscillate and the actual oscillation of the cantilever, the phase difference being responsive to an electrical state of the circuitry in the die, and wherein using the response to detect an electrical characteristic of the circuitry includes using the detected phase difference.

9. The method of claim 4, further comprising using a feedback loop adapted to adjust the position of the. cantilever in response to deflection of the cantilever.

10. The method of claim 1, further comprising pre-scanning the thinned back side with the atomic force microscope while the die is operated at a first state, wherein detecting a response includes detecting a change in the response as compared to the response obtained during the pre-scanning.

11. The method of claim 1, further comprising pre-scanning the thinned back side with the atomic force microscope, the pre-scanning including detecting the topography of the thinned back side, wherein using the response to detect an electrical characteristic of the circuitry includes subtracting a response to the topography of the die detected during the pre-scanning.

12. The method of claim 1, wherein scanning the thinned back side with an atomic force microscope and detecting a response comprises:

positioning a cantilever over the insulator portion of the SOI die, the cantilever being adapted to deflect in response to an electrical state of circuitry in the die; and positioning a scanning tunneling microscope sufficiently close to the end of the cantilever and detecting the deflection thereof with the scanning tunneling microscope, wherein using the response to detect an electrical characteristic of the circuitry includes using the detected deflection to detect the electrical characteristic.

13. The method of claim 1, further comprising mapping the detected response to circuitry in the die.

14. The method of claim 13, wherein mapping the detected response to circuitry in the die includes using a circuit layout of the die and a position sensor adapted to detect the position of the response from the atomic force microscope.

15. The method of claim 1, wherein using the response to detect an electrical characteristic of the circuitry includes obtaining a waveform from the response, further comprising analyzing the electrical characteristic represented by the waveform.

16. The method of claim 1, further comprising operating the die, wherein detecting a response includes detecting a response to the operation.

17. The method of claim 16, wherein operating the die includes operating the die in a loop selected to cause a failure condition.

18. The method of claim 1, further comprising detecting a response from a non-defective die in the same manner as the die being analyzed, the non-defective die having the same design as the die being analyzed, and comparing the analysis of the dies.

19. A system for analyzing a semiconductor die having silicon-on-insulator (SOI) structure and circuitry in a circuit side opposite a back side, the system comprising:

an atomic force microscope adapted to scan a thinned back side of the die and detect a response to the die; and means for using the response to detect an electrical characteristic of the circuitry.

20. A system for analyzing a semiconductor die having silicon-on-insulator (SOI) structure and circuitry in a circuit side opposite a back side, the system comprising:

an atomic force microscope adapted to scan a thinned back side of the die and detect a response to the die; and a detection arrangement adapted to use the response to detect an electrical characteristic of the circuitry.

21. The system of claim 20, wherein the detection arrangement is adapted to compare a response to an electrical state of the die detected by the atomic force microscope to a reference and to detect the electrical state of the die therefrom.

22. The system of claim 20, wherein the atomic force microscope comprises:

a cantilever adapted to deflect in response to an electrical state of the die;

a laser adapted to direct laser light at the cantilever; and a split photodiode adapted to detect a deflection of a reflection of the laser light.

23. The system of claim 22, wherein the detection arrangement is adapted to use the detected deflection to determine an electrical state of the circuitry.

24. A system for analyzing a semiconductor die having silicon-on-insulator (SOI) structure and circuitry in a circuit side opposite a back side, the system comprising:

means including an atomic force microscope, for scanning a thinned back side of the die and detect a response to the die; and means for using the response to detect an electrical characteristic of the circuitry.

* * * * *

UNITED STATES PATENT AND TRADEMARK OFFICE
CERTIFICATE OF CORRECTION

PATENT NO.   : 6,448,096 B1
DATED        : September 10, 2002
INVENTOR(S)  : Birdsley et al.

It is certified that error appears in the above-identified patent and that said Letters Patent is hereby corrected as shown below:

Column 4,
Line 60, "NanoScope® controller" should read -- NanoScope® III controller --.

Column 5,
Line 52, "the path of the reflection 170." should read -- in the path of the reflection 170 --.

Column 7,
Line 36, after "of the." please delete ".".

Signed and Sealed this

Twenty-fifth Day of February, 2003

JAMES E. ROGAN
*Director of the United States Patent and Trademark Office*